United States Patent
Thompson

(10) Patent No.: US 10,242,469 B2
(45) Date of Patent: Mar. 26, 2019

(54) METHOD AND APPARATUS FOR PROVIDING A PRESUMPTIVE DRAFTING SOLUTION

(71) Applicant: Autodesk, Inc., San Rafael, CA (US)

(72) Inventor: Daniel Lee Thompson, Hutto, TX (US)

(73) Assignee: AUTODESK, INC., San Rafael, CA (US)

(*) Notice: Subject to any disclaimer, the term of this patent is extended or adjusted under 35 U.S.C. 154(b) by 247 days.

(21) Appl. No.: 15/250,603

(22) Filed: Aug. 29, 2016

(65) Prior Publication Data

US 2016/0364890 A1  Dec. 15, 2016

Related U.S. Application Data

(60) Continuation of application No. 12/135,862, filed on Jun. 9, 2008, now abandoned, which is a division of application No. 09/946,311, filed on Sep. 5, 2001, now Pat. No. 7,401,299.

(51) Int. Cl.

| | | |
|---|---|---|
| *G06T 11/20* | (2006.01) | |
| *G06F 17/50* | (2006.01) | |
| *G06F 3/0484* | (2013.01) | |
| *G06F 3/0488* | (2013.01) | |
| *G06F 3/033* | (2013.01) | |
| *G06F 3/0482* | (2013.01) | |

(52) U.S. Cl.
CPC ............ *G06T 11/203* (2013.01); *G06F 3/033* (2013.01); *G06F 3/0482* (2013.01); *G06F 3/04842* (2013.01); *G06F 3/04883* (2013.01); *G06F 17/50* (2013.01)

(58) Field of Classification Search
None
See application file for complete search history.

(56) References Cited

U.S. PATENT DOCUMENTS

| | | |
|---|---|---|
| 4,788,659 A | 11/1988 | Berry et al. |
| 4,951,231 A | 8/1990 | Dickinson et al. |
| 5,101,436 A | 3/1992 | DeAguiar et al. |
| 5,123,087 A | 6/1992 | Newell et al. |
| 5,133,052 A | 7/1992 | Bier et al. |
| 5,237,647 A | 8/1993 | Roberts et al. |
| 5,252,951 A | 10/1993 | Tannenbaum et al. |
| 5,287,417 A * | 2/1994 | Eller ................ G06K 9/222 345/619 |
| 5,325,475 A | 6/1994 | Poggio et al. |

(Continued)

*Primary Examiner* — Christopher J Fibbi
(74) *Attorney, Agent, or Firm* — Gates & Cooper LLP

(57) ABSTRACT

A method, apparatus, and article of manufacture for providing a presumptive drafting solution. Input from a cursor control device is received, wherein the input reflects a movement in a computer drawing program of a cursor over a drawing having one or more geometric entities (having one or more geometric attributes). In one or more embodiments, a relevant geometric entity is identified based on how the cursor is moved over the drawing. A presumptive drafting solution is then provided based on the identified relevant geometric entity. In addition, prior drawing solutions (having one or more solution attributes) are obtained and compared to the one or more geometric attributes. A drawing solution having one or more solution attributes similar to the one or more geometric attributes may be provided to the user.

10 Claims, 7 Drawing Sheets

(56) References Cited

U.S. PATENT DOCUMENTS

| | | | |
|---|---|---|---|
| 5,371,845 A | | 12/1994 | Newell et al. |
| 5,396,590 A | | 3/1995 | Kreegar |
| 5,408,606 A | | 4/1995 | Eckart |
| 5,463,722 A | | 10/1995 | Venolia |
| 5,513,303 A | | 4/1996 | Robertson et al. |
| 5,513,309 A | | 4/1996 | Meier et al. |
| 5,523,775 A | | 6/1996 | Capps |
| 5,544,265 A | | 8/1996 | Bozinovic et al. |
| 5,572,639 A | * | 11/1996 | Gantt ................ G06F 17/50 345/651 |
| 5,615,283 A | * | 3/1997 | Donchin ............ G06K 9/00416 382/187 |
| 5,623,418 A | | 4/1997 | Rostoker et al. |
| 5,689,667 A | | 11/1997 | Kurtenbach |
| 5,704,028 A | | 12/1997 | Schanel et al. |
| 5,712,965 A | | 1/1998 | Fujita et al. |
| 5,734,805 A | | 3/1998 | Isensee et al. |
| 5,734,806 A | | 3/1998 | Narayanaswami |
| 5,734,807 A | | 3/1998 | Sumi |
| 5,740,273 A | | 4/1998 | Parthasarathy et al. |
| 5,805,167 A | * | 9/1998 | van Cruyningen ... G06F 3/0482 715/808 |
| 6,016,147 A | | 1/2000 | Gantt |
| 6,219,049 B1 | | 4/2001 | Zuffante et al. |
| 6,229,542 B1 | | 5/2001 | Miller |
| 6,323,859 B1 | | 11/2001 | Gantt |
| 6,499,043 B1 | | 12/2002 | Forcier |
| 2002/0141643 A1 | | 10/2002 | Jaeger |
| 2002/0150297 A1 | | 10/2002 | Gorbatov et al. |
| 2002/0171671 A1 | | 11/2002 | Bou et al. |
| 2005/0138656 A1 | | 6/2005 | Moore et al. |

\* cited by examiner

METHOD AND APPARATUS FOR PROVIDING A PRESUMPTIVE DRAFTING SOLUTION

CROSS-REFERENCE TO RELATED APPLICATIONS

This application is a continuation of and claims the benefit under 35 U.S.C. Section 120 of the following co-pending and commonly-assigned U.S. utility patent application(s), which is/are incorporated by reference herein:

Utility application Ser. No. 12/135,862, filed Jun. 9, 2008, by Daniel Lee Thompson, entitled "METHOD AND APPARATUS FOR PROVIDING A PRESUMPTIVE DRAFTING SOLUTION", which application is a divisional application of Utility application Ser. No. 09/946,311, filed Sep. 5, 2001, by Daniel Lee Thompson, entitled "METHOD AND APPARATUS FOR PROVIDING A PRESUMPTIVE DRAFTING SOLUTION" now U.S. Pat. No. 7,401,299, issued on Jul. 15, 2008.

This application is related to the following co-pending and commonly-assigned United States patent application, which application and all additional applications in the cited list herein are incorporated by reference herein:

Application Ser. No. 09/092,014, filed Jul. 9, 2001, by Brian D. Gantt, entitled "Determining and Displaying Geometric Relationships Between Objects in a Computer-Implemented Graphics System", which is a continuation of commonly-assigned U.S. application Ser. No. 09/419,539, filed Oct. 18, 1999, by Brian D. Gantt, entitled "Method and System for Interactively Determining and Displaying Geometric Relationships Between Three Dimensional Objects Based on Predetermined Geometric Constraints and Position of an Input Device", which is a continuation of commonly-assigned U.S. application Ser. No. 08/744,241, filed Nov. 5, 1996, by Brian D. Gantt, now U.S. Pat. No. 6,016,147, issued Jan. 18, 2000, entitled "Method and System for Interactively Determining and Displaying Geometric Relationships Between Three Dimensional Objects Based on Predetermined Geometric Constraints and Position of an Input Device", which is a continuation-in-part of U.S. application entitled "Method And Apparatus For Interactively Manipulating and Displaying Presumptive Relationships Between Graphic Objects" by the same inventor, Ser. No. 08/436,158, filed May 8, 1995, which issued on Nov. 5, 1996 as U.S. Pat. No. 5,572,639.

BACKGROUND OF THE INVENTION

1. Field of the Invention

The present invention relates generally to computer drawing programs, and in particular, to a method, apparatus, and article of manufacture for providing suggestions for a drawing solution in a computer drawing program.

2. Description of the Related Art

The use of Computer Aided Design (CAD) and drawing programs is well known in the art. Such programs may include presumptive drafting techniques that attempt to provide a possible solution or suggestion to a user in a drawing. For example, the CAD software may suggest a specific point to a user who is trying to pick a point for geometry construction (e.g., suggest the endpoint of a line that the user's cursor has approached). In more complex forms, presumptive drafting can suggest the appropriate placement and orientation of objects such as doors in walls or faucets on pipes.

Prior art presumptive drafting systems analyze geometry and look for points (or angles or rotations, etc.) of interest. In the simplest case, the system examines only points of interest on a single object, such as the endpoints and midpoint of a line segment. Getting more complex, the system may examine various extensions off of the geometry, such as perpendicular or orthogonal projections from those various points of interest.

However, as the complexity grows, a very large number of items of interest may be generated very quickly. Consider an example with two line segments and a circle. The system may start with the basics of the line segments' endpoints and midpoints as well as the circle's center. The intersection point of where the two lines (or their extensions) meet may then be added, as well as any points where the lines (or extensions) intersect the circle. Orthogonal extensions (paralleling the X, Y, and Z-axes) and perpendicular extensions (ninety (90) degrees from the line in some predefined plane) are added from these points of interest. The system may then begin to examine where those items intersect resulting in over a hundred points of interest and twenty lines of interest. There may also be several other methods of interest, such as tangent, parallel, as well as geometry that could connect the various points of interest. Further, the geometry under consideration is very rarely as simple as two line segments and a circle. Consequently, the number of potential solutions grows exponentially into an unmanageable number with the user actually interested in at most one solution.

These potential solutions may be maintained in a list. Presumptive drafting solutions may limit the number of potential solutions in the list by limiting the types of interest (endpoint, midpoint, extensions, etc.) or by only considering a subset of the geometry on the screen or by only considering solutions near the user's cursor. A geometric entity may be added to the list of items of interest that generate potential solutions merely by having a cursor control device (such as a mouse) pass over the geometric entity long enough for a background selection process to pick the passed over geometric entity. However, in such a prior art technique, no distinction is made for how the cursor control device moved over a drawing or geometric entity. Further, with additional prior art methods that limit the solutions to a manageable number of solutions, the solution the user is actually interested in may be trimmed out as well.

SUMMARY OF THE INVENTION

One or more embodiments of the invention provide presumptive drafting solutions to a user. A cursor's movement in a drawing is evaluated to determine whether a particular pattern or gesture identifies a particular geometric entity in a drawing. For example, a circle may identify a point. A mouse movement away from the point may signify an extension in the direction of the movement (e.g., perpendicular, tangential, etc.). Once a geometric entity has been identified, potential drafting solutions are provided to the user. Thus, if a point is identified, drafting solutions based on that point may be assigned higher priority. Similarly, if an extension is identified, drafting solutions containing the extension may be assigned higher priority.

Additionally, prior drafting solutions accepted by a user may be obtained and stored. Such prior drafting solutions may include other geometry in the current drawing, accepted solutions for similar work in another drawing, or a set of rules that define one or more potential drafting solutions. The prior drafting solutions are compared to the current drawing attributes (or potential drawing solutions that have been identified) to determine the most similar drawing solution. Once a similar drawing solution has been identified, the solution is provided to the user. Such a solution may be provided by assigning a higher priority to a similar solution or by limiting the available solutions to the similar solutions prior to exposing other solutions to a user.

Once a solution has been accepted by a user, the acceptance may be utilized to update the prior drafting solution in a type of auto-correction. For example, a list of sorted prior drafting solutions may be resorted such that the accepted solution is assigned a higher priority. Accordingly, the next time the prior solutions are used in a comparison, the solution previously accepted by the user may be provided to the user prior to other solutions.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Presumptive drafting solutions are provided to a user. The cursor movement is evaluated to determine whether a particular pattern or gesture is identifying a particular geometric entity in a drawing. Once a geometric entity has been identified, potential drafting solutions are provided to the user. Additionally, prior drafting solutions accepted by a user may be compared to the current drawing attributes (or potential drawing solutions) to determine the most similar drawing solution. Once a similar drawing solution has been identified, the solution is provided to the user.

Hardware and Software Environment

Figure 1:
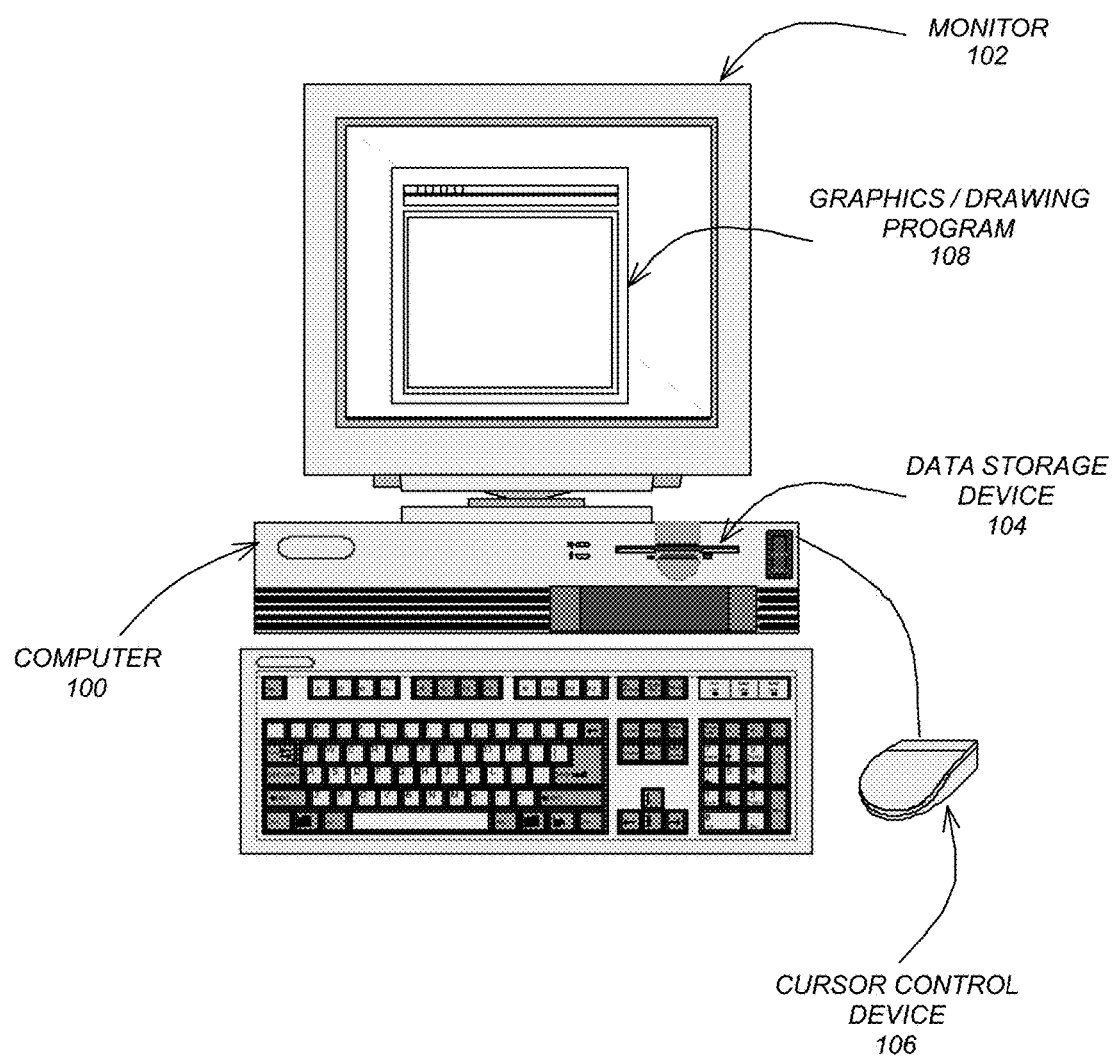
FIG. 1 is an exemplary hardware and software environment used to implement one or more embodiments of the invention.

FIG. 1 is an exemplary hardware and software environment used to implement one or more embodiments of the invention. Embodiments of the invention are typically implemented using a computer 100, which generally includes, inter alia, a monitor 102, data storage devices 104, cursor control devices 106, and other devices. Those skilled in the art will recognize that any combination of the above components, or any number of different components, peripherals, and other devices, may be used with the computer 100.

One or more embodiments of the invention may be implemented by a computer-implemented graphics/drawing program 108, wherein the graphics program 108 is represented by a window displayed on the monitor 102. Generally, the graphics program 108 comprises logic and/or data embodied in or readable from a device, media, carrier, or signal, e.g., one or more fixed and/or removable data storage devices 104 connected directly or indirectly to the computer 100, one or more remote devices coupled to the computer 100 via a data communications device, etc.

Those skilled in the art will recognize that the exemplary environment illustrated in FIG. 1 is not intended to limit the present invention. Indeed, those skilled in the art will recognize that other alternative environments may be used without departing from the scope of the present invention.

Computer-Implemented Graphics Program

Figure 2:
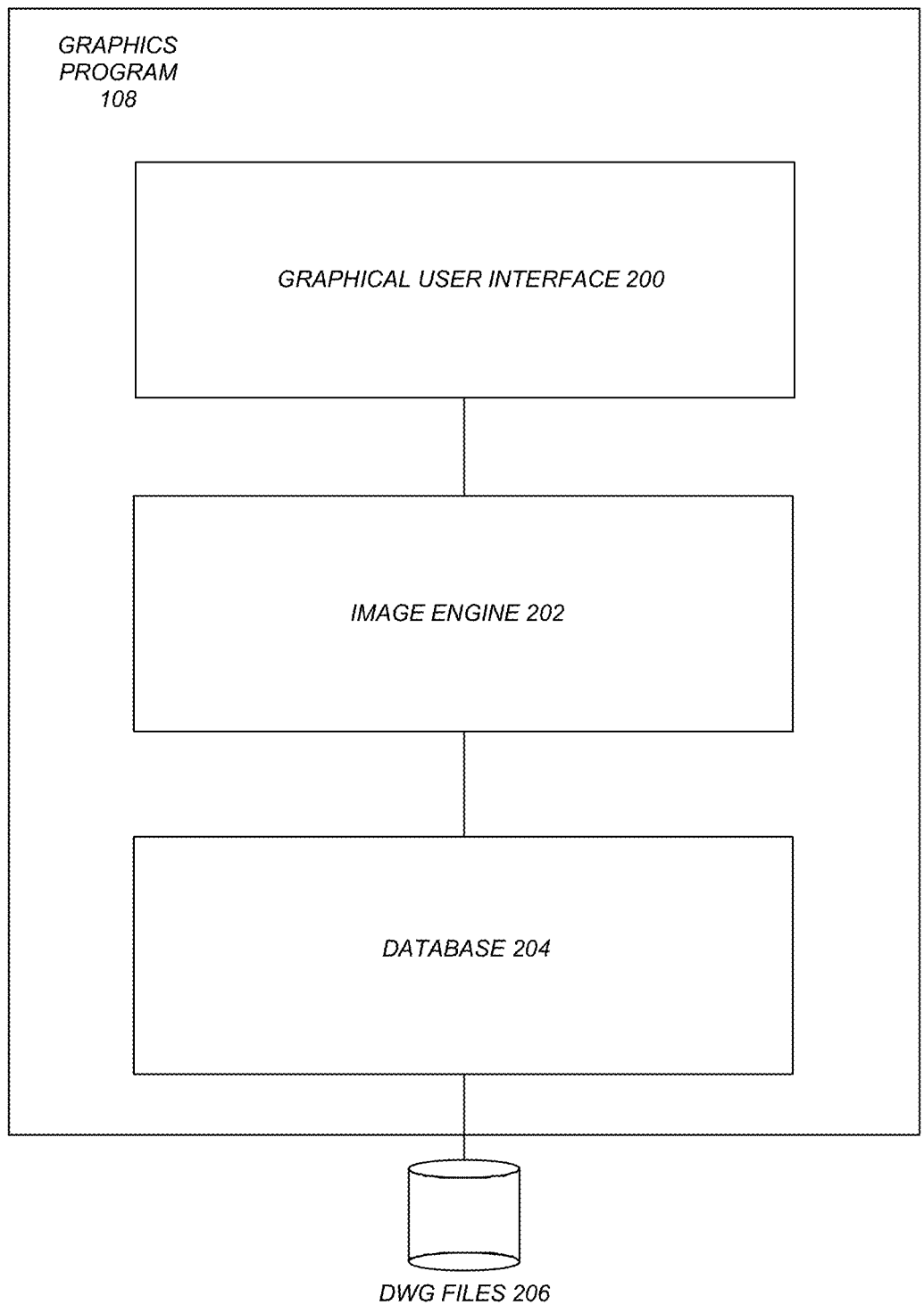
FIG. 2 is a block diagram that illustrates the components of a graphics program in accordance with one or more embodiments of the invention.

FIG. 2 is a block diagram that illustrates the components of the graphics program 108 according to the preferred embodiment of the present invention. There are three main components to the graphics program 108, including: a Graphical User Interface (GUI) 200, an Image Engine (IME) 202, and a database (DB) 204 for storing objects in Drawing (DWG) files 206.

The Graphical User Interface 200 displays information to the operator and provides the functionality for the operator's interaction with the graphics program 108.

The Image Engine 202 processes the DWG files 206 and delivers the resulting graphics to the monitor 102 for display. In the preferred embodiment, the Image Engine 202 provides a complete application programming interface (API) that allows other computer programs to interface to the graphics program 108 as needed.

Prioritization Based on Cursor Movement

In one or more embodiments of the invention, image engine 202 is utilized to determine and provide one or more presumptive drafting solutions that are stored in database 204 and presented to a user on graphical user interface 200. Image engine 202 provides a presumptive drafting solution by prioritizing potential solutions. These potential solutions are prioritized by prioritizing the geometry of a drawing that is considered for use in a solution. In turn, the geometry is prioritized by analyzing the movements of a cursor control device 106 for particular hints or gestures.

In one or more embodiments of the invention image, engine 202 analyzes the cursor control device 106 movements over and around the geometry of a drawing to prioritize the user's interest level in that geometry (or in part of that geometry). The prioritization may then be used to sort potential solutions or to limit which solutions are considered/calculated (i.e., low priority geometry may not be considered in searching for solutions unless higher priority solutions have all been rejected by the user).

The following examples illustrate how a cursor's movement is evaluated to identify relevant geometry in accordance with one or more embodiments of the invention.

Figure 3:
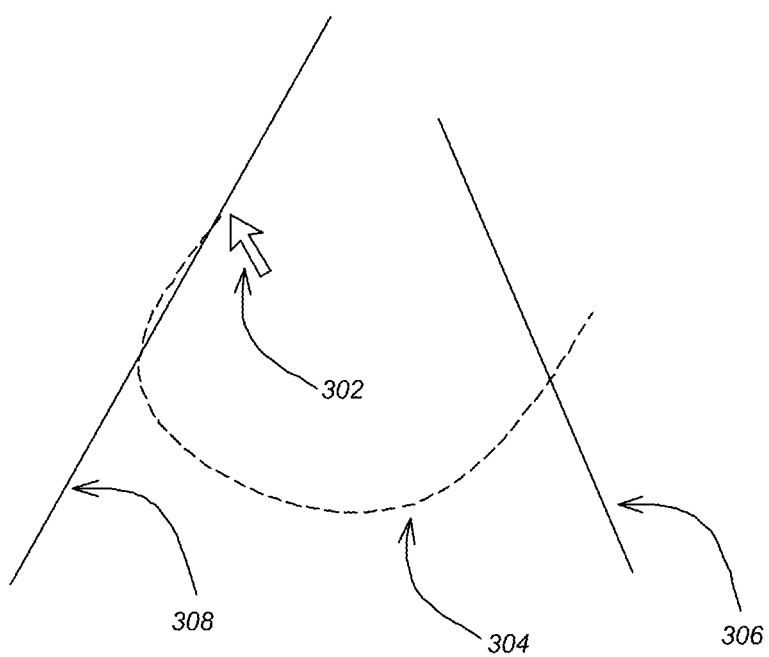
FIG. 3 illustrates the prioritization of existing lines (and their linear extensions) based on the movement of a cursor across the line in accordance with one or more embodiments of the invention.

FIG. 3 illustrates the prioritization of existing lines (and their linear extensions) based on the movement of a cursor across a line. The cursor 302 (whose movement is controlled by cursor control device 106) has been moved along path 304 across lines 306 and 308. The cursor 302 moves across line 306 at a steep angle. Cursor 302 moves across line 308 at a very shallow angle, nearly paralleling line 308 for a reasonable distance. As a result of the movement on path 304, line 306 may be assigned a very low priority while the line 308 (and its collinear extension) may be assigned a very high priority.

Figure 4:
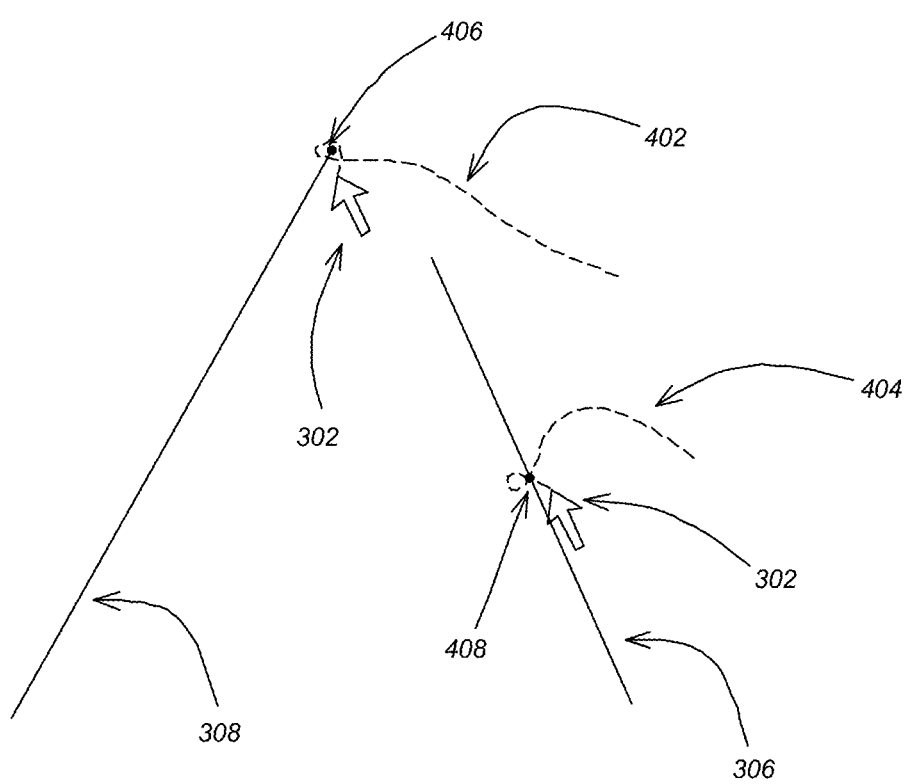
FIG. 4 illustrates the prioritization of a geometrically interesting point based on a cursor hovering or performing a gesture over such a point in accordance with one or more embodiments of the invention.

FIG. 4 illustrates the prioritization of a geometrically interesting point based on a cursor hovering or performing a gesture over such a point. The cursor 302 (whose movement is controlled by cursor control device 106) has been moved along paths 402 and path 404. Paths 402 and 404 perform gestures over geometrically interesting points 406 and 408 respectively. On path 402, cursor 302 moves around the endpoint 406 of line 308 in a circle. On path 404, cursor 302 moves across the midpoint 302 of line 306 in an X. The two points 306 and 308 identified by the gestures (i.e., the circle and the X) indicate that the user is interested in the points 306 and 308. Accordingly, points 406 and 408 may be assigned higher priority than other points such as endpoints of line 306 or the midpoint or lower endpoint of line 308.

In addition to (or instead of) identifying points 406 and 408 as being of interest to the user, the two gestures (i.e., the circle and the X) may be associated with an additional meaning. For example, a circle or an X around a point may specify an interest in extensions from that point. Alternatively, a circle or X around a point may specify a user's disinterest in a point to eliminate that point from consideration. Accordingly, how a cursor 302 is moved determines relevant geometric entities.

The gestures indicated by paths 402 and 404 are examples of the types of gestures that may be used. Any gesture may be utilized in accordance with embodiments of the invention. Further, instead of an identifiable/distinguishable gesture, merely allowing a cursor 302 to linger over each point for a certain period of time may identify one or more points on a drawing (e.g., points 406 and 408).

Figure 5:
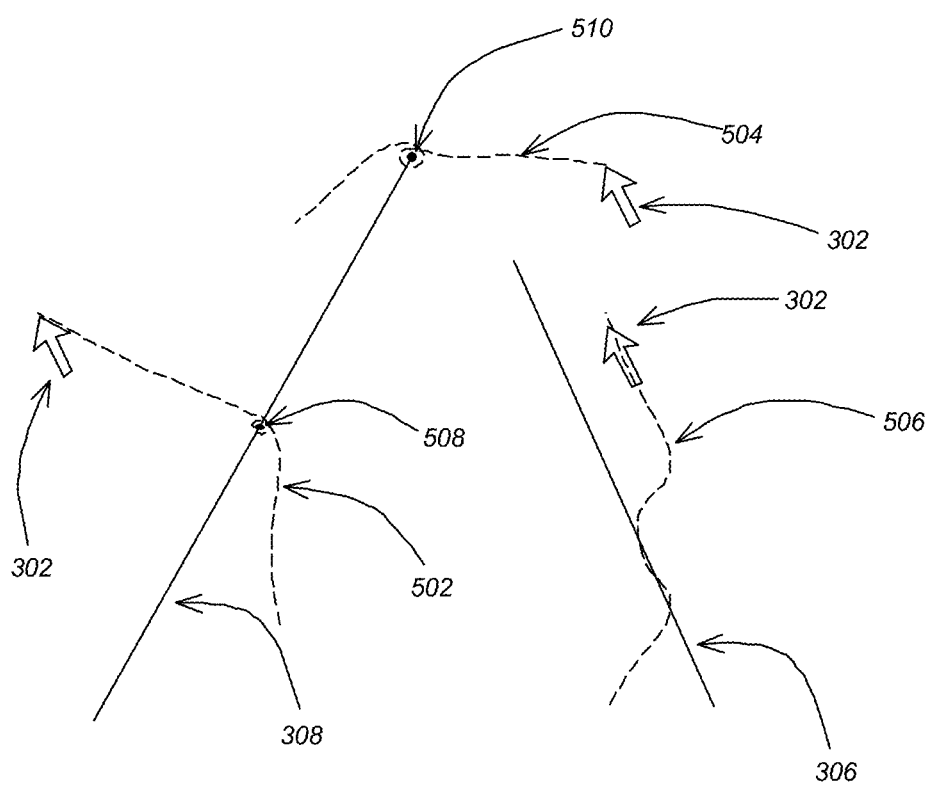
FIG. 5 illustrates the prioritization of a geometric entity based on a cursor moving away from or along a geometric entity in accordance with one or more embodiments of the invention.

FIG. 5 illustrates the prioritization of a geometric entity based on a cursor moving away from or along the geometric entity. Three cursor 302 paths 502, 504, and 506 moving along interesting extensions are illustrated in FIG. 5. Path 502 lingers over the midpoint 508 of line 308 and then moves away at a perpendicular extension from that line. As a result, the perpendicular extension from midpoint 508 is assigned a higher priority than the horizontal or vertical extensions from point 508.

Path 504 lingers over endpoint 510 of line 308 and then moves away horizontally. As a result, the horizontal extension from endpoint 510 is assigned a higher priority than the vertical or perpendicular extensions from that point.

Path 506 moves along line 306 briefly and then away from line 306 a short distance before proceeding in parallel to line 306. As a result, the angle of line 306 may be assigned a high priority. This prioritization of an angle is useful when a user is seeking an alignment or angle rather than a specific point.

Figure 6:
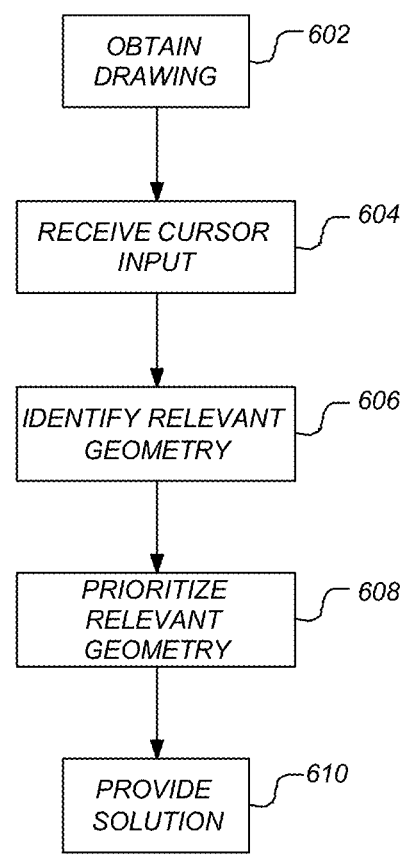
FIG. 6 is a flow chart illustrating the process of providing a presumptive drafting solution based on cursor movement in accordance with one or more embodiments of the invention.

FIG. 6 is a flow chart illustrating the process of providing a presumptive drafting solution based on cursor movement in accordance with one or more embodiments of the invention. At step 602 a drawing having one or more geometric entities is obtained. A geometric entity as described herein refers to a discrete or non-discrete geometry in a drawing. Geometric entities comprise any property of a geometry or drawing including angles, points, lines, shapes (e.g., circles, ellipses, squares, rectangles, etc.), grids, and/or extensions from points, lines, or shapes (e.g., tangent lines, perpendicular lines, horizontal lines, parallel lines, etc.).

At step 604, cursor input is received from a cursor control device 106. The cursor input reflects the movement of the cursor across a drawing. At step 606, one or more relevant geometric entities are identified based on how the cursor moves over the drawing. Accordingly, as described above, the path of the cursor is evaluated to determine any relevant geometry identified by the path. For example, in FIG. 3, lines 306 and 308 are identified by path 304. Similarly, in FIG. 4, points 406 and 408 are identified, and in FIG. 5, points 508 and 510 and extensions from those points are identified.

At step 608, the identified geometric entities are prioritized based on the cursor movement. For example, as described above, a circle around a point (e.g., path 402 of FIG. 4), hovering over a point, or an X on a point (e.g., path 404 of FIG. 4) identifies a point (and/or extensions from that point) as high priority. Similarly, hovering over, circling, or following a point or line and then moving away or paralleling the point or line at a certain angle (e.g., paths 502, 504, and 506 of FIG. 5) may identify an extension as high priority. Accordingly, how a cursor is moved with respect to existing geometric entities of a drawing determines the priority of the existing geometric entities and/or extensions of the existing geometric entities.

The prioritization of step 608 may comprise sorting the potential geometric solutions while placing the identified relevant geometric entities at the top (or bottom) of the sorted list. Alternatively, the prioritization may comprise limiting the available solutions to the higher (or lower) priority solutions until the user rejects all of the higher (or lower) priority solutions.

Once the solutions have been prioritized, the solutions may be suggested/provided to the user at step 610.

Prioritization Based on Similarity

In one or more embodiments of the invention, image engine 202 provides a potential/possible solution based on the similarity (determined by a comparison) between the current drawing and prior drawing solutions accepted by the user. This comparison between prior accepted solutions and the current geometry of a drawing is based on the presumption that the solution the user prefers is likely similar to a solution the user (or another user) previously accepted/utilized.

Solutions can be similar in many ways and the more ways in which a solution is similar to a current drawing or geometry, the higher the solution may score in an overall similarity rating. Many features may be examined to determine similarity. The aspects/features of a drawing/geometry that are utilized in a comparison are referred to as attributes. Thus, geometric attributes of a drawing are compared to solution attributes of potential solutions to determine similarity.

Any attribute or property of a drawing/geometric entity may be considered or used as a basis for the similarity comparison. Some of these attributes are described below. However, the number and type of attributes considered are not intended to be limited to those described below. Examples of attributes include line styles, line weights, color, or layer. For example, a dashed line may have behaved very differently from a solid line in previous solutions.

Specifics of a geometric solution may also be attributes that are considered. For example, lines may only connect at specific angles.

Additionally, offsets and alignments with other geometry may be considered. For example, rectangles on a "desks" layer may always be placed three inches to the left of boxes on a "wall sockets" layer. Similarly, coffee tables may always parallel sofas at a given distance.

Further, extensions from the geometry may be attributes that are considered. For example, blue circles may usually be tangent to yellow lines and the perpendicular extensions from their endpoints.

In addition to the particular attributes that are examined in the similarity comparison, which prior solutions to examine may also be a factor. Generally, the user is drawing some real world system, and things in the real world have a certain consistency. Based on this presumption, the current geometry being drawn is likely similar and consistent with other existing geometry in the drawing. Thus, the prior solutions examined may simply be the other existing geometry in the drawing. For example, a circuit diagram may have consistencies in how the various electrical connections are made, and that shows up in how the geometry interacts with itself in a repetitive manner.

Alternatively, the prior solutions that are examined may be other geometry that the user (or another user) has drawn in the past. Such geometry may exist in the current drawing or other drawings. For example, by comparing to and utilizing such a set of solutions, a user may start a new circuit diagram and have the solutions of his prior circuit diagrams to draw on.

In addition to examining solutions from the current drawing and other prior drawings, prior solutions may be extracted and generalized into a set of solution rules for a specific type of work. Based on the solution rules and the geometry being drawn, particular solutions would be provided/suggested to a user. Further, a set of solution rules may be particular for a specific type of drawing or geometry. For example, a set of solution rules may exist for running pipes through walls. Another set of solutions rules may exist for placing electrical elements in a house. The sets of solution rules may be managed automatically (e.g., inherit a set of rules from other drawings) by image engine 202 or database 204, may be managed explicitly by the user, or may be established across multiple users performing the same type of work.

In addition to the image engine 202 developing a set of solution rules based on specific user actions, a third party (e.g., a CAD vendor) may independently develop a set of behavior rules for certain objects or geometry in order to provide preferred smart objects to a user. For example, smart air ducts may be given strongly reinforced (i.e., 100% correct) prior solutions that always terminate in ceiling vents. Additionally, such third party rule development may allow independent business relationships wherein certain parts or models of third parties are suggested in certain circumstances.

When an appropriate prior solution has been examined for its similarity to the present solutions being considered, those solutions will be sorted so that the solutions most similar to the prior ones are the first solutions presented to the user. Additionally, the provided/suggested solutions and/or prioritization may be self-correcting in that the order of the sorted list of solutions may be updated when a prior drawing solution is accepted or rejected by a user. Thus, the user's actions (in accepting or rejecting a suggested solution) may be stored and used to self-correct the solution prioritization.

In a self-correcting embodiment, if a user does not accept the suggested solution (e.g., by merely passing on the solution or if the user requests a different solution [e.g., by some explicit action like hitting the <TAB> key]), image engine 202 may store and use the non-acceptance to adjust the similarities and/or prioritization of solutions. Image engine 202 may also conduct a further analysis of the rejected solution and the current drawing to reprioritize solutions. For example, the current situation may be different from prior drawings (based on different circumstances or information) or prior solutions may have been abnormalities. Accordingly, the majority or higher percentage of accepted solutions may still be presented to a user instead of the abnormally accepted solution. Additionally, if a user accepts a top priority solution, image engine 202 knows/learns that the similar prior solution was a good guide.

The following examples illustrate similarity comparisons to determine an appropriate solution suggestion. Suppose a user is drawing a line on a layer (a logical grouping of data that are like transparent acetate overlays on a drawing; layers can be viewed individually or in combination) referred to as "leads", and has already chosen a start point and is now looking for the endpoint. Three potential solutions are under consideration: the endpoint of another line on the "leads" layer, the midpoint of a line on the "leads" layer, and the center of a circle on layer "sockets".

By examining prior solutions, it is determined that multiple lines exist on the "leads" layer. These multiple lines may be examined to determine where their endpoints were placed. For example, upon examination, it may be determined that many endpoints were placed at the endpoints of other lines on the "leads" layer. Further, there are no lines wherein the endpoint fell on the midpoint of another line on the "leads" layer. Additionally, several line endpoints on the "leads" layer exist on the center of circles on the "sockets" layer. Accordingly, when basing suggestions/solutions on a similarity with prior solutions, midpoint solutions may be eliminated or given low priority compared to endpoint or circle-center solutions.

Continuing with the above example, examination may also determine that while lines on the "leads" layer often go from the "leads" layer to other points on the "leads" layer and from the "leads" layer to the "sockets" layer, lines never go from a point on the "sockets" layer to another point on the "sockets" layer. Accordingly, if the line also started at the center of a circle on the "sockets" layer, potential solutions direct the user to endpoints on a line in the "leads" layer and away from points on the "sockets" layer.

Figure 7:
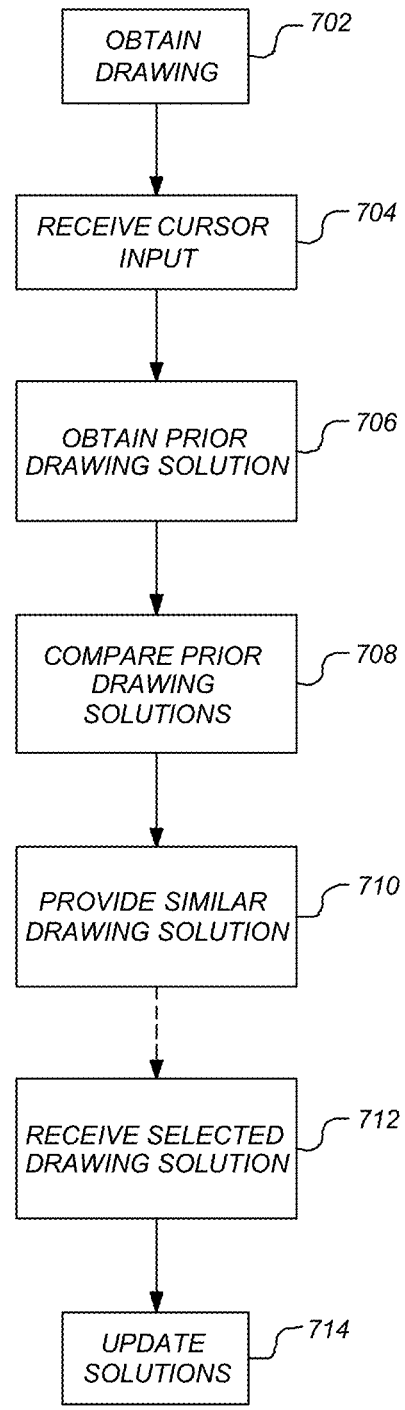
FIG. 7 is a flow chart illustrating the process of providing a presumptive drafting solution based on similarity in accordance with one or more embodiments of the invention.

FIG. 7 is a flow chart illustrating the process of providing a presumptive drafting solution based on similarity in accordance with one or more embodiments of the invention. At step 702, a drawing is obtained wherein the drawing has one or more geometric entities that each have one or more geometric attributes. At step 704, image engine 202 receives cursor input from a user. At step 706, one or more prior drawing solutions are obtained wherein each of the obtained drawings have one or more solution attributes.

At step 708, the one or more prior drawing solutions are compared to either the list of solutions currently being considered or the geometry currently being drawn by the user. To conduct the comparison, one or more solution attributes from the one or more prior drawing solutions are compared to solution attributes of the current list of drawing solutions being considered. Alternatively, one or more solution attributes from the one or more prior drawing solutions are compared to one or more geometric attributes of the geometric entity being drawn.

Thus, the geometric attributes of the current entity being drawn (or the other geometric entities in the drawing) may be compared to geometric entities of prior drawing solutions (i.e., the other drawings on the page, solutions accepted by a user in the past, or solutions that comply with the set of rules). Similarly, if an analysis of the cursor movements as described above result in multiple possible drawing solutions, the attributes of the multiple possible drawing solutions may then be compared to attributes of prior drawing solutions actually selected by the user to determine the most relevant solution.

When a similar prior drawing solution is found, the prior drawing solution is provided to the user at step 710. As described above, providing the drawing solution to the user may be implemented in various ways. For example, the similar drawing solution may be given higher priority in a list of drawing solutions. Alternatively (or in addition to a sorted list), a group of similar drawing solutions (sorted or not) may be the first drawing solutions offered to the user for consideration. Such a group of similar drawing solutions may be required to be eliminated prior to offering any other prior drawing solutions.

At step 712, the prior drawing solution accepted by the user is obtained/received. At step 714, the list of prior drawing solutions is updated/auto-corrected to reflect the user's acceptance of a particular drawing solution.

As described, by using a similarity comparison, a user is not presented with an excessive amount of non-applicable/non-interesting drawing solutions. Instead, a user is provided with desirable solution suggestions that are obtained without limiting the types of extrapolations that a presumptive drafting system can consider. Further, with self-correcting capability, as the body of prior solutions is built up and refined, the geometry and objects behave in a manner that the user expects (i.e., preferring certain types of connections, placements, alignments, etc.) without the user having done anything explicit to collect that knowledge.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide the prioritization of a geometric entity based on how the cursor is moved on a drawing. Additionally, prior drawing/drafting solutions are compared to the current geometry in a drawing and potential solutions are suggested based on similarity.

One or more benefits of the invention may include that when a solution is suggested to a user, there is a greater chance that the solution will be the solution that the user desires. Such a prioritization is performed without extensive effort or actions by the user.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for providing a presumptive drafting solution comprising:
   (a) maintaining a prior solution list of one or more prior drawing solutions of a computer drawing program, wherein each of the one or more prior drawing solutions has been previously accepted and previously utilized by a user as a drawing solution;
   (b) receiving input from a cursor control device relating to a first geometric entity of one or more drawings;
   (c) identifying, based on the input, a current list of one or more potential drawing solutions for the first geometric entity;
   (d) comparing the current list to the prior solution list to determine a most relevant solution from the prior solution list, wherein the comparing comprises comparing solution attributes from the prior drawing solutions to solution attributes of the current list;
   (e) providing and displaying, for the first geometric entity, the most relevant solution, wherein:
      (1) the prior solution list is sorted based on solutions previously selected more often by a user;
      (2) the most relevant solution comprises the prior drawing solution selected most often in the past; and
   (f) updating an order of the sorted prior solution list whenever one of the prior drawing solutions is accepted or rejected by a user, thereby resulting in a self-correcting prior solution list.

2. The computer-implemented method of claim 1 wherein a prior drawing solution comprises other geometry that a user of the one or more drawings has drawn in the past.

3. The computer-implemented method of claim 1 wherein a prior drawing solution comprises a set of solution rules for a specific type of work.

4. The computer-implemented method of claim 3 wherein the solution rules are inherited from other drawings.

5. The computer-implemented method of claim 3 wherein the solution rules are established across multiple users doing a similar type of work.

6. An apparatus for providing a presumptive drafting solution in a computer system comprising:
   (a) a computer system having a memory, a display device, and a cursor control device coupled thereto;
   (b) a computer drawing program executing on the computer system, wherein the computer drawing program:
      (i) maintains a prior solution list of one or more prior drawing solutions of a computer drawing program, wherein each of the one or more prior drawing solutions has been previously accepted and previously utilized by a user as a drawing solution;
      (ii) receives input from the cursor control device relating to a first geometric entity of one or more drawings;
      (iii) identifies, based on the input, a current list of one or more potential drawing solutions for the first geometric entity;
      (iv) compares the current list to the prior solution list to determine a most relevant solution from the prior solution list, wherein the comparing comprises comparing solution attributes from the prior drawing solutions to solution attributes of the current list; and
      (v) provides and displays, for the first geometric entity, the most relevant solution, wherein:
         (1) the prior solution list is sorted based on solutions previously selected more often by a user;
         (2) the most relevant solution comprises the prior drawing solution selected most often in the past; and
      (vi) updates an order of the sorted prior solution list whenever one of the prior drawing solutions is accepted or rejected by a user, thereby resulting in a self-correcting prior solution list.

7. The apparatus method of claim 6 wherein a prior drawing solution comprises other geometry that a user of the one or more drawings has drawn in the past.

8. The apparatus method of claim 6 wherein a prior drawing solution comprises a set of solution rules for a specific type of work.

9. The apparatus method of claim 8 wherein the solution rules are inherited from other drawings.

10. The apparatus method of claim 8 wherein the solution rules are established across multiple users doing a similar type of work.

* * * * *